US010423040B2

(12) United States Patent
Xi et al.

(10) Patent No.: US 10,423,040 B2
(45) Date of Patent: Sep. 24, 2019

(54) LIQUID CRYSTAL DISPLAY APPARATUS

(71) Applicant: Au Optronics Corporation, Hsinchu (TW)

(72) Inventors: Peng-Bo Xi, Taipei (TW); Sung-Yu Su, Tainan (TW); Kung-Ching Chu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 15/952,250

(22) Filed: Apr. 13, 2018

(65) Prior Publication Data

US 2019/0212622 A1 Jul. 11, 2019

(30) Foreign Application Priority Data

Jan. 5, 2018 (TW) .............................. 107100420 A

(51) Int. Cl.
*G02F 1/1343* (2006.01)
*G02F 1/1362* (2006.01)
(Continued)

(52) U.S. Cl.
CPC ...... *G02F 1/136227* (2013.01); *G02F 1/1368* (2013.01); *G02F 1/13394* (2013.01);
(Continued)

(58) Field of Classification Search
CPC ......... G02F 1/134309; G02F 1/136286; G02F 1/1368; G02F 1/134363; G02F 1/133707;
(Continued)

(56) References Cited

U.S. PATENT DOCUMENTS 10,303,012 B2   5/2019 Chu et al.
2003/0199114 A1  10/2003 Fukagawa
(Continued)

FOREIGN PATENT DOCUMENTS

CN   106662785   5/2017
TW   200304566   10/2003
(Continued)

*Primary Examiner* — Thoi V Duong
(74) *Attorney, Agent, or Firm* — JCIPRNET

(57) ABSTRACT

A liquid crystal display apparatus includes an array substrate, a liquid crystal layer, and an opposite substrate. The array substrate includes a first pixel and a second pixel. The first pixel includes a first active device and a first pixel electrode. The first pixel electrode is electrically connected to the first active device via a first through-hole. The first pixel electrode includes a plurality of first electrode strips extended along a first direction. The first through-hole is located at a first corner of the first pixel electrode. The second pixel includes a second active device and a second pixel electrode. The second pixel electrode is connected to the second active device via a second through-hole. The second pixel electrode includes a plurality of second electrode strips extended along a second direction. The second through-hole is located at a second corner of the second pixel electrode. A virtual straight line connecting between the first corner and the second corner is substantially not parallel to the first direction.

20 Claims, 8 Drawing Sheets

(51) Int. Cl.
  *G02F 1/1368* (2006.01)
  *G02F 1/1339* (2006.01)
  *H01L 29/786* (2006.01)
  *H01L 27/12* (2006.01)
  *H05K 9/00* (2006.01)
  *G02F 1/1335* (2006.01)

(52) U.S. Cl.
  CPC .. *G02F 1/133512* (2013.01); *G02F 1/134309* (2013.01); *G02F 1/136286* (2013.01); *H01L 27/124* (2013.01); *H01L 29/78696* (2013.01); *H05K 9/0054* (2013.01); *G02F 1/133514* (2013.01)

(58) Field of Classification Search
  CPC ......... G02F 1/134336; G02F 1/133345; G02F 1/136227; G02F 1/133512; G02F 1/136209; G02F 1/1343; G02F 1/1362; G02F 1/1333; G02F 1/136; G02F 1/13394; G02F 1/133514; G02F 2001/134345; G02F 2001/134318; G02F 2001/133357; G02F 2201/123; G02F 2201/122; H01L 29/41733; H01L 29/458; H01L 29/4908; H01L 29/78696; H01L 27/124; H05K 9/0054; G09G 2300/0426; G09G 2300/0447
  See application file for complete search history.

(56) References Cited

U.S. PATENT DOCUMENTS

| | | |
|---|---|---|
| 2017/0176792 A1* | 6/2017 | Sonoda ............. G02F 1/133345 |
| 2017/0219899 A1 | 8/2017 | Furukawa et al. |
| 2018/0267370 A1 | 9/2018 | Chu et al. |

FOREIGN PATENT DOCUMENTS

| | | |
|---|---|---|
| TW | 201039006 | 11/2010 |
| TW | I600954 | 10/2017 |

* cited by examiner

LIQUID CRYSTAL DISPLAY APPARATUS

CROSS-REFERENCE TO RELATED APPLICATION

This application claims the priority benefit of Taiwan application serial no. 107100420, filed on Jan. 5, 2018. The entirety of the above-mentioned patent application is hereby incorporated by reference herein and made a part of this specification.

BACKGROUND OF THE INVENTION

Field of the Invention

The invention relates to a liquid crystal display apparatus, and more particularly, to a liquid crystal display apparatus including a first pixel and a second pixel.

Description of Related Art

In recent years, with the continued progress in display techniques, the observer's demand for the display quality (such as image resolution and color saturation) of a display is also becoming higher. However, to manufacture a display with high performance, the transmittance and liquid crystal efficiency of the pixels in the display need to be increased.

In a regular display, the pixels in the array substrate only have one configuration. As a result, pixel electrodes in the array substrate cannot achieve the optimal configuration in the display region, such that a lot of invalid space exits in the display region so that the transmittance of the display cannot be increased. Therefore, a method solving the above issues is urgently needed.

SUMMARY OF THE INVENTION

At least one embodiment of the invention provides a liquid crystal display apparatus that can alleviate the issue of insufficient transmittance of the known liquid crystal display apparatus.

At least one embodiment of the invention provides a liquid crystal display apparatus including an array substrate, a liquid crystal layer, and an opposite substrate. The array substrate includes a first pixel and a second pixel. The first pixel includes a first active device and a first pixel electrode. The first pixel electrode is electrically connected to the first active device via a first through-hole. The first pixel electrode includes a plurality of first electrode strips substantially extended along a first direction. The first through-hole is located at a first corner of the first pixel electrode. The second pixel includes a second active device and a second pixel electrode. The second pixel electrode is connected to the second active device via a second through-hole. The second pixel electrode includes a plurality of second electrode strips substantially extended along a second direction. The second through-hole is located at a second corner of the second pixel electrode. A virtual straight line connecting between the first corner and the second corner is substantially not parallel to the first direction. The liquid crystal layer is located between the array substrate and the opposite substrate.

At least one embodiment of the invention provides a liquid crystal display apparatus including an array substrate, a liquid crystal layer, and an opposite substrate. The array substrate includes a first pixel, a second pixel, a first signal line, a second signal line, and a transmission line. The first pixel includes a first active device and a first pixel electrode. The first pixel electrode is electrically connected to the first active device via a first through-hole. The first pixel electrode includes a plurality of first electrode strips substantially extended along a first direction. The second pixel includes a second active device and a second pixel electrode. The second pixel electrode is connected to the second active device via a second through-hole. The second pixel electrode includes a plurality of second electrode strips substantially extended along a second direction. The first active device is electrically connected to the first signal line and the transmission line. The second active device is electrically connected to the second signal line and the transmission line. The horizontal distance between the first through-hole and the transmission line is L1. The horizontal distance between the second through-hole and the transmission line is L2. L1 is different from L2, and $0.02 \leq L2/L1 \leq 0.3$. The liquid crystal layer is located between the array substrate and the opposite substrate.

One of the objects of the invention is to increase the transmittance of the liquid crystal display apparatus.

One of the objects of the invention is to increase the liquid crystal efficiency of the liquid crystal display apparatus.

One of the objects of the invention is to increase the aperture ratio of the liquid crystal display apparatus.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
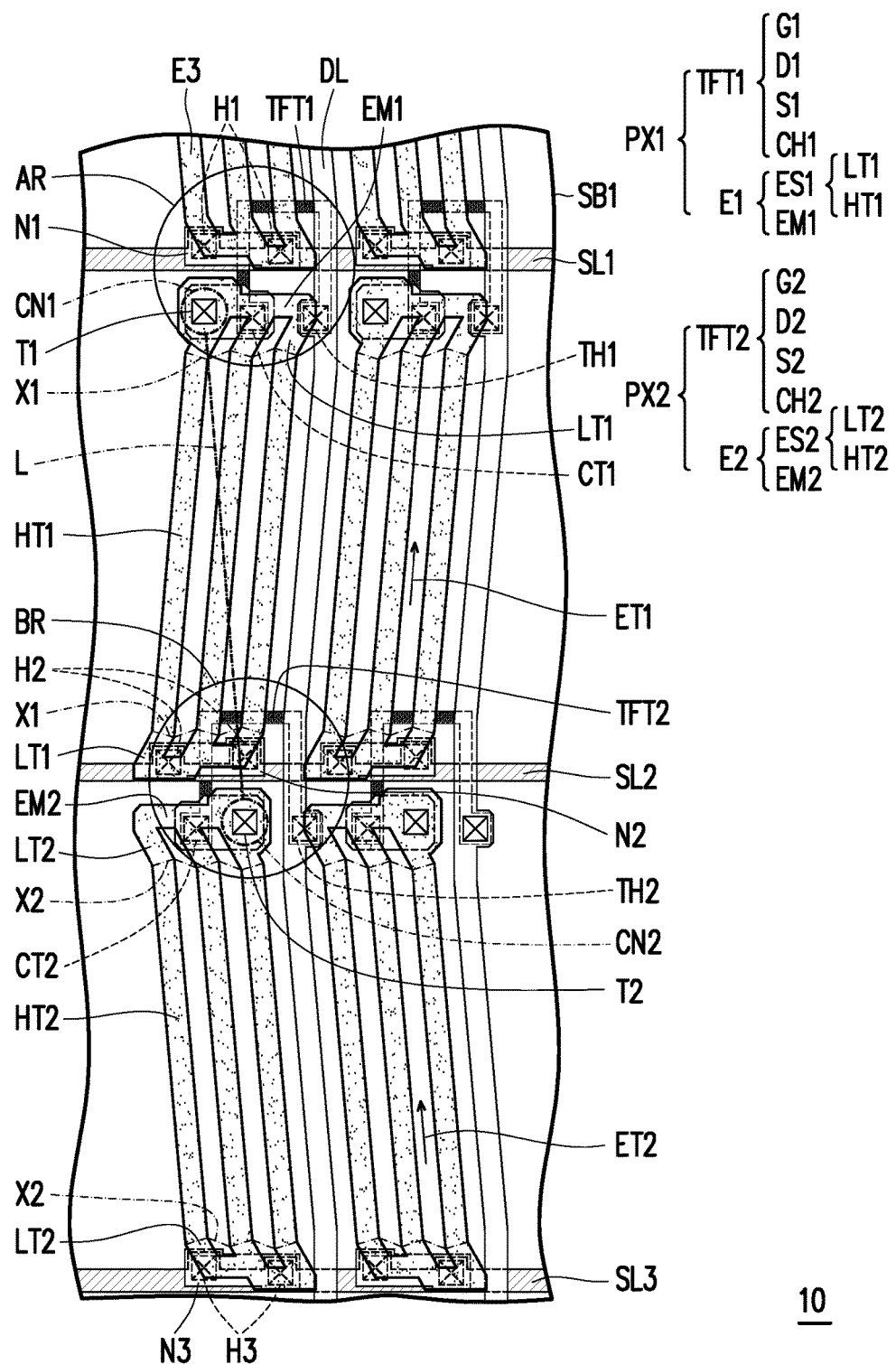
FIG. 1 is a top view of a display apparatus according to an embodiment of the invention.
Figure 2A:
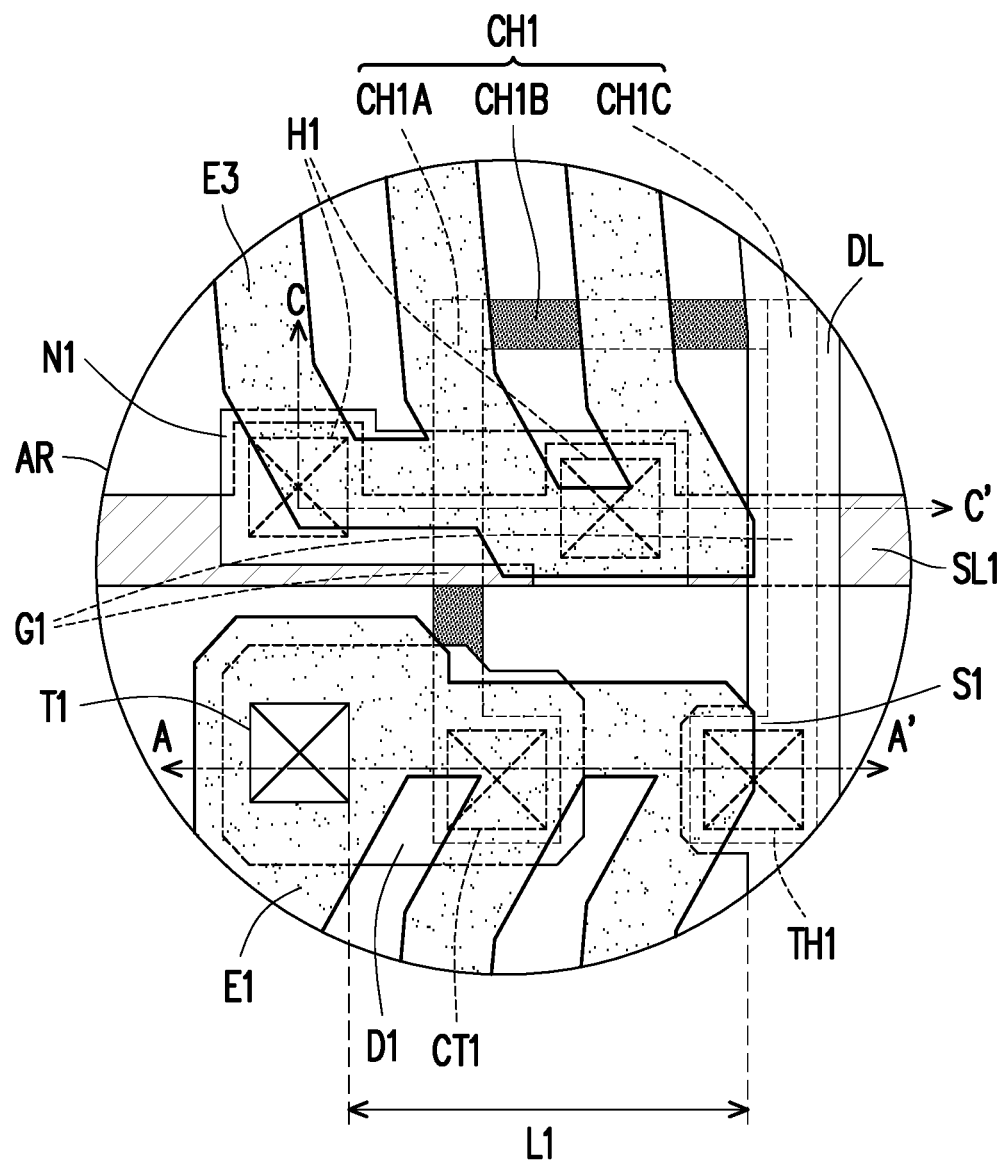
FIG. 2A is a partially-enlarged view of region AR in FIG. 1.
Figure 2B:
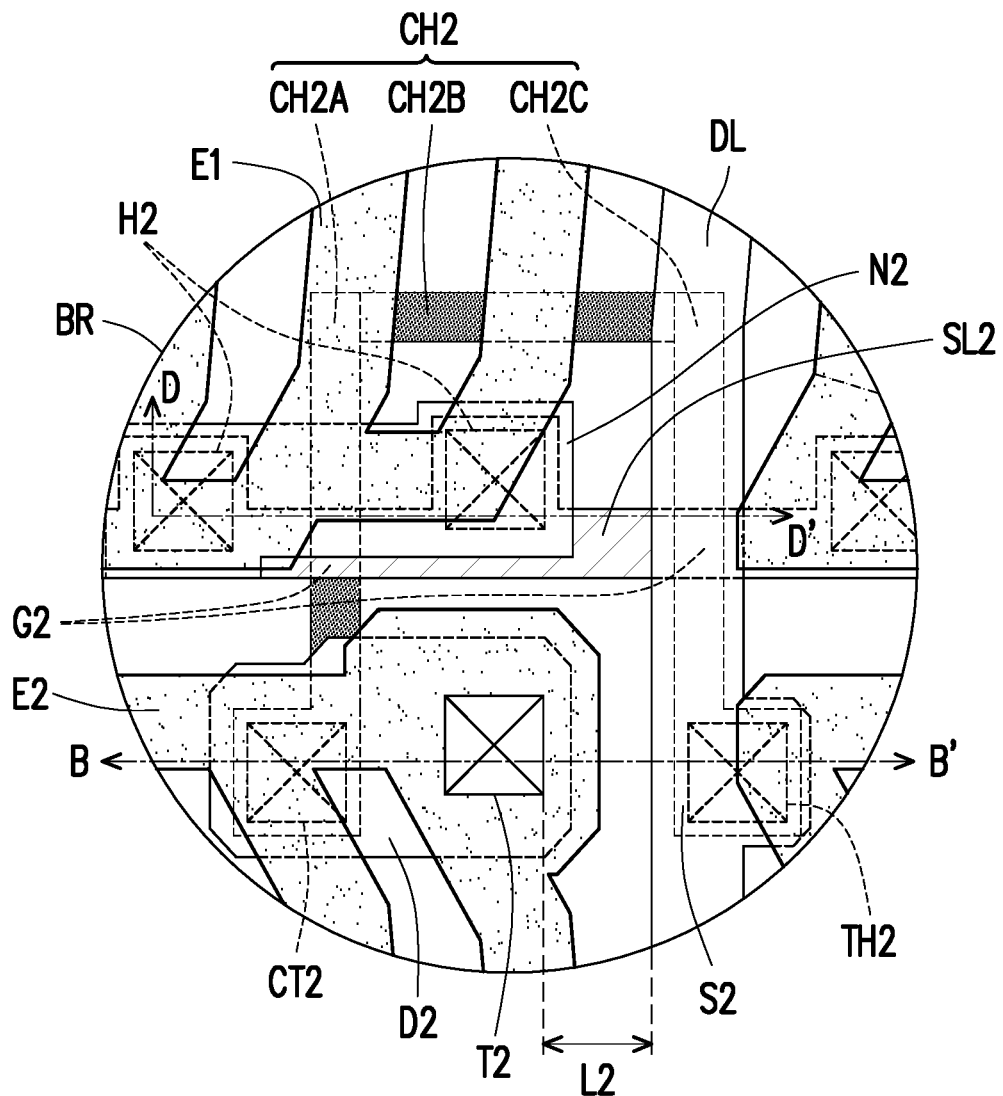
FIG. 2B is a partially-enlarged view of region BR in FIG. 1.
Figure 3A:
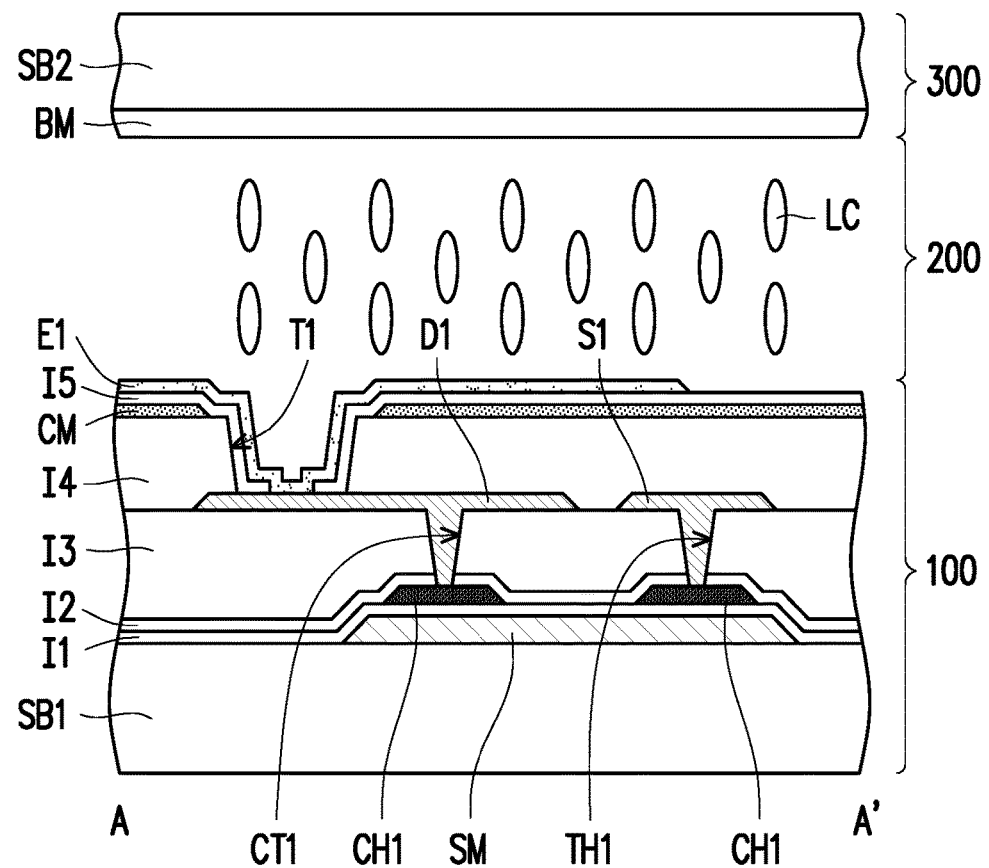
FIG. 3A is a cross section along section line AA' of FIG. 2A.
Figure 3B:
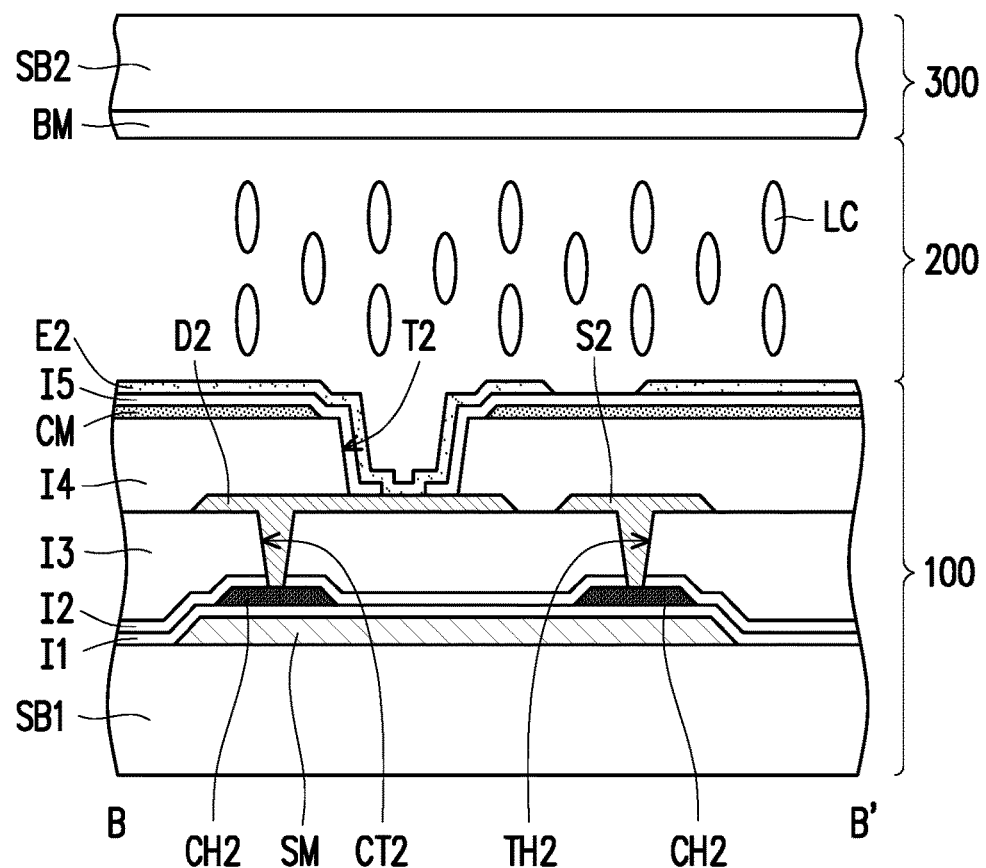
FIG. 3B is a cross section along section line BB' of FIG. 2B.
Figure 3C:
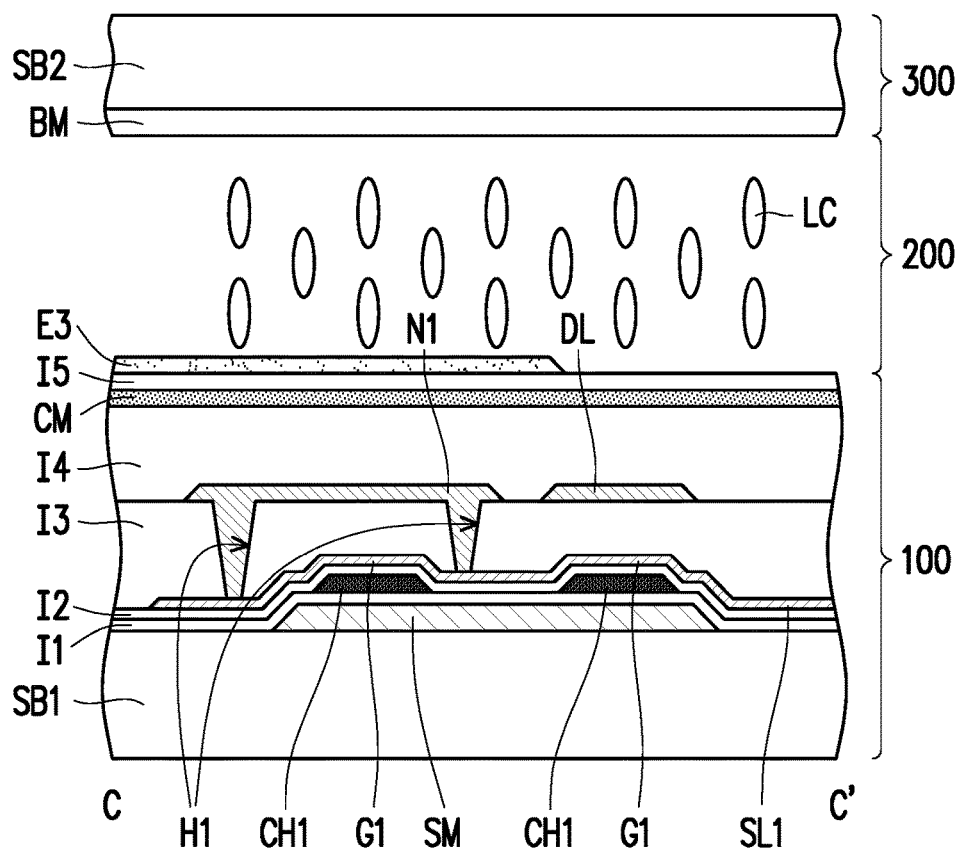
FIG. 3C is a cross section along section line CC' of FIG. 2A.
Figure 3D:
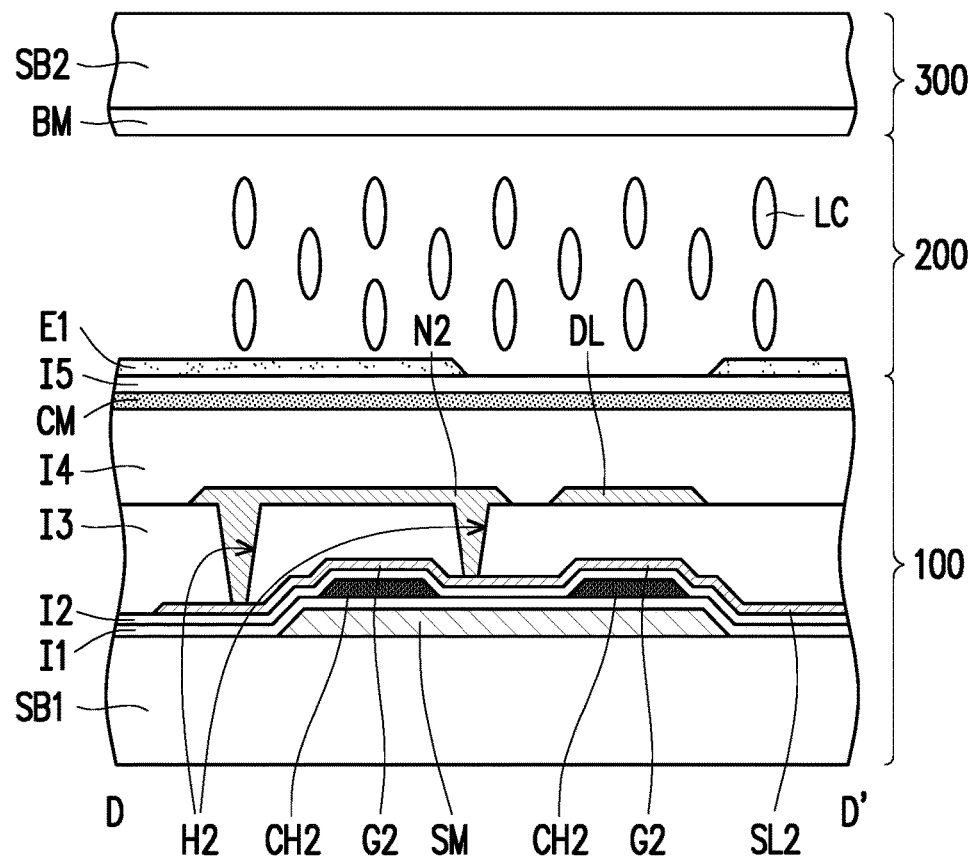
FIG. 3D is a cross section along section line DD' of FIG. 2B.

FIG. 1 is a top view of a display apparatus according to an embodiment of the invention. FIG. 2A is a partially-enlarged view of region AR in FIG. 1. FIG. 2B is a partially-enlarged view of region BR in FIG. 1. FIG. 3A is a cross section along section line AA' of FIG. 2A. FIG. 3B is a cross section along section line BB' of FIG. 2B. FIG. 3C is a cross section along section line CC' of FIG. 2A. FIG. 3D is a cross section along section line DD' of FIG. 2B.

For ease of explanation, FIG. 1, FIG. 2A, and FIG. 2B omit a shielding layer SM, a liquid crystal layer 200, an opposite substrate 300, a spacer PS, a common electrode CM, and first to fifth insulating layers I1 to I5.

Referring to FIG. 1, FIG. 3A, and FIG. 3B, a liquid crystal display apparatus 10 includes an array substrate 100, a liquid crystal layer 200, and an opposite substrate 300. The liquid crystal layer 200 is located between the array substrate 100 and the opposite substrate 300. The liquid crystal layer 200 includes a liquid crystal medium LC, and the liquid crystal medium LC can be a liquid crystal molecule, an electrophoretic display medium, or other suitable media. The display medium in the following embodiments of the invention is exemplified by a liquid crystal molecule, but the invention is not limited thereto.

The array substrate 100 includes a substrate SB1, a first pixel PX1, a second pixel PX2, a first signal line SL1, a second signal line SL2, a third signal line SL3, and a transmission line DL. The first pixel PX1, the second pixel PX2, the first signal line SL1, the second signal line SL2, the third signal line SL3, and the transmission line DL are located on the substrate SB1. The first signal line SL1, the second signal line SL2, and the third signal line SL3 are interlaced with the transmission line DL.

The first pixel PX1 includes a first active device TFT1 and a first pixel electrode E1. The second pixel PX2 includes a second active device TFT2 and a second pixel electrode E2. The first active device TFT1 and the second active device TFT2 are respectively electrically connected to the first signal line SL1 and the second signal line SL2. The first signal line SL1 and the second signal line SL2 are, for instance, scan lines. The first active device TFT1 and the second active device TFT2 are electrically connected to the transmission line DL, and the transmission line DL is, for instance, a data line. In the present embodiment, the extending direction of the portion of the transmission line DL adjacent to a first electrode strip ES1 is substantially the same as the first direction ET1, and the extending direction of the portion of the transmission line DL adjacent to a second electrode strip ES2 is substantially the same as the second direction ET2, but the invention is not limited thereto. In the present embodiment, the second direction ET2 is not parallel or perpendicular to the first direction ET1.

Referring to FIG. 1, FIG. 2A, and FIG. 3A, the first active device TFT1 includes a first gate G1, a first semiconductor layer CH1, a first source S1, and a first drain D1. The first gate G1 is electrically connected to the first signal line SL1. The first gate G1 is located on the first semiconductor layer CH1 and is separated from the first semiconductor layer CH1 by a second insulating layer I2. The first semiconductor layer CH1 includes, for instance, a U-shape formed by a first portion CH1A, a second portion CH1B, and a third portion CH1C connected in order, but the invention is not limited thereto. In other embodiments, the first semiconductor layer CH1 includes, for instance, a 7-shape formed by a first portion CH1A, a second portion CH1B, and a third portion CH1C connected in order. In the present embodiment, the shielding layer SM is disposed between the first semiconductor layer CH1 and the substrate SB1, and the first insulating layer I1 is disposed between the first semiconductor layer CH1 and the shielding layer SM, but the invention is not limited thereto. The shielding layer SM is, for instance, a metal layer that can reduce the interference to the first semiconductor layer CH1 by an external electromagnetic wave or reduce the leakage current phenomenon of the first semiconductor layer CH1.

The first source S1 and the first drain D1 are electrically connected to the first semiconductor layer CH1. The first source S1 is electrically connected to the transmission line DL, and the transmission line DL is, for instance, a data line. The first semiconductor layer CH1 is electrically connected to the first source S1 via a first opening TH1. The first semiconductor layer CH1 is electrically connected to the first drain D1 via a first contact hole CT1. In the present embodiment, the contact hole (not labeled) in the second insulating layer I2 and the contact hole (not labeled) in the third insulating layer I3 are connected to each other to form the first contact hole CT1, and the opening (not labeled) in the second insulating layer I2 and the opening (not labeled) in the third insulating layer I3 are connected to each other to form the first opening TH1, but the invention is not limited thereto. In some embodiments, the third insulating layer I3 between the first drain D1 and the first semiconductor layer CH1 may be omitted so that the first contact hole CT1 only includes the contact hole in the second insulating layer I2, and the first opening TH1 only includes the opening in the second insulating layer I2.

The first pixel electrode E1 includes a first connecting portion EM1 and a plurality of first electrode strips ES1. The first electrode strips ES1 are substantially extended along the first direction ET1. The invention does not limit that the first electrode strip ES1 needs to be entirely extended along the same direction, only that the main portion of the first electrode strip ES1 needs to be substantially extended along the first direction ET1. For instance, a single first electrode strip ES1 can have a portion HT1 and a portion LT1, the portion HT1 and the portion LT1 are, for instance, formed by the same film layer, the portion HT1 is the main portion of the first electrode strip ES1 and extended along the first direction ET1, and the first electrode strip ES1 has a kink located between the portion HT1 and the portion LT1. Among the kinks in the first pixel electrode E1, a virtual line X1 connecting the kinks is not a straight line. Due to the presence of the kinks, at least another extending direction different from the first direction ET1 can exist at the location of the first electrode strips ES1 adjacent to the first signal line SL1 and the second signal line SL2, and the design of at least another extending direction at the location of the first electrode strips ES1 adjacent to the first signal line SL1 and the second signal line SL2 can further facilitate the alignment of the liquid crystal.

The first pixel electrode E1 includes a portion HT1 corresponding to a high-transmittance region and a portion LT1 corresponding to a low-transmittance region. The portion HT1 and the portion LT1 are, for instance, defined by the virtual line X1, and at least a portion of the portion HT1 can be located between two separate portions LT1.

The first connecting portion EM1 is electrically connected to the plurality of first electrode strips ES1, and in the present embodiment, the first connecting portion EM1 is, for instance, electrically connected to three of the first electrode strips ES1, but is not limited thereto. The first connecting portion EM1 and the plurality of first electrode strips ES1 are, for instance, formed by the same film layer. The first connecting portion EM1 is, for instance, overlapped with the first through-hole T1 and the first contact hole CT1.

The fourth insulating layer I4 is located between the first pixel electrode E1 and the first drain D1. The fourth insulating layer I4 has a first through-hole T1. The first pixel electrode E1 is electrically connected to the first drain D1 of the first active device TFT1 via the first through-hole T1. For instance, the first connecting portion EM1 of the first pixel electrode E1 is electrically connected to the first drain D1 of the first active device TFT1 via the first through-hole T1. The first through-hole T1 is located at a first corner CN1 of the first pixel electrode E1. The horizontal distance between the first through-hole T1 and the transmission line DL is L1.

In the present embodiment, a common electrode CM and a fifth insulating layer I5 are further disposed between the first pixel electrode E1 and the fourth insulating layer I4, wherein the fifth insulating layer I5 is located between the first pixel electrode E1 and the common electrode CM. The common electrode CM and the fifth insulating layer I5 respectively have a through-hole corresponding to the first through-hole T1, and the first pixel electrode E1 is further filled in the through-holes in the common electrode CM and the fifth insulating layer I5 to be electrically connected to the first drain D1, wherein the common electrode CM is not connected to the first pixel electrode E1 and the first drain D1.

Referring to FIG. 1, FIG. 2B, and FIG. 3B, the second active device TFT2 includes a second gate G2, a second semiconductor layer CH2, a second source S2, and a second drain D2. The second gate G2 is electrically connected to the second signal line SL2. The second gate G2 is located on the second semiconductor layer CH2 and is separated from the second semiconductor layer CH2 by a second insulating layer I2. The second semiconductor layer CH2 includes, for instance, a U-shape formed by a first portion CH2A, a second portion CH2B, and a third portion CH2C connected in order, but the invention is not limited thereto, and in other embodiments, the second semiconductor layer CH2 includes, for instance, a 7-shape formed by the first portion CH2A, the second portion CH2B, and the third portion CH2C connected in order. In the present embodiment, the shielding layer SM is disposed between the second semiconductor layer CH2 and the substrate SB1, and the first insulating layer I1 is disposed between the second semiconductor layer CH2 and the shielding layer SM, but the invention is not limited thereto. The shielding layer SM is, for instance, a metal layer that can reduce the interference to the second semiconductor layer CH2 caused by an external electromagnetic wave or reduce the leakage current phenomenon of the second semiconductor layer CH2.

The second source S2 and the second drain D2 are electrically connected to the second semiconductor layer CH2. The second semiconductor layer CH2 is electrically connected to the second drain D2 via a second contact hole CT2. The second semiconductor layer CH2 is electrically connected to the second source S2 via a second opening TH2. The second source S2 is electrically connected to the transmission line DL. In the present embodiment, the contact hole (not labeled) in the second insulating layer I2 and the contact hole (not labeled) in the third insulating layer I3 are connected to each other to form a second contact hole CT2, and the opening (not labeled) in the second insulating layer I2 and the opening (not labeled) in the third insulating layer I3 are connected to each other to form a second opening TH2, but the invention is not limited thereto. In some embodiments, the third insulating layer I3 between the second drain D2 and the second semiconductor layer CH2 may be omitted. The second contact hole CT2 only includes the contact hole in the second insulating layer I2, and the second opening TH2 only includes the opening in the second insulating layer I2.

In the present embodiment, although the shapes of the first semiconductor layer CH1 and the second semiconductor layer CH2 are both U-shapes, the shape of the first semiconductor layer CH1 at the first contact hole CT1 and the first opening TH1 is slightly different from the shape of the second semiconductor layer CH2 at the second contact hole CT2 and the second opening TH2.

The second pixel electrode E2 includes a second connecting portion EM2 and a plurality of second electrode strips ES2. The second electrode strips ES2 are substantially extended along the second direction ET2. The invention does not limit that the second electrode strip ES2 needs to be entirely extended along the same direction, only that the main portion of the second electrode strip ES2 needs to be substantially extended along the second direction ET2. For instance, a single second electrode strip ES2 can have a portion HT2 and a portion LT2, the portion HT2 and the portion LT2 are, for instance, formed by the same film layer, the portion HT2 is the main portion of the second electrode strip ES2 and extended along the second direction ET2, and the second electrode strip ES2 has a kink located between the portion HT2 and the portion LT2. Among the kinks in the second pixel electrode E2, a virtual line X2 connecting kinks is not a straight line. Due to the presence of the kinks, at least another extending direction different from the second direction ET2 can exist at the location of the second electrode strips ES2 adjacent to the second signal line SL2 and the third signal line SL3, and the design of at least another extending direction at the location of the second electrode strips ES2 adjacent to the second signal line SL2 and the third signal line SL3 can further facilitate the alignment of the liquid crystal.

The second pixel electrode E2 includes a portion HT2 corresponding to a high-transmittance region and a portion LT2 corresponding to a low-transmittance region. The portion HT2 and the portion LT2 are, for instance, defined by the virtual line X2, and at least a portion of the portion HT2 can be located and connected between two separate portions LT2.

The second connecting portion EM2 is electrically connected to the plurality of second electrode strips ES2, and in the present embodiment, the second connecting portion EM2 is, for instance, electrically connected to three of the second electrode strips ES2, but is not limited thereto. The second connecting portion EM2 and the plurality of second electrode strips ES2 are, for instance, formed by the same film layer. The second connecting portion EM2 is, for instance, overlapped with the second through-hole T2 and the second contact hole CT2.

The fourth insulating layer I4 is located between the second pixel electrode E2 and the second drain D2. The fourth insulating layer I4 has a second through-hole T2. The second pixel electrode E2 is electrically connected to the second drain D2 of the second active device TFT2 via the second through-hole T2. For instance, the second connecting portion EM2 of the second pixel electrode E2 is electrically connected to the second drain D2 of the second active device TFT2 via the second through-hole T2. The second through-hole T2 is located at a second corner CN2 of the second pixel electrode E2. The horizontal distance between the second through-hole T2 and the transmission line DL is L2. The distance L1 is not equal to the distance L2, and $0.02 \leq L2/L1 \leq 0.3$.

In the present embodiment, a common electrode CM and a fifth insulating layer I5 are further disposed between the second pixel electrode E2 and the fourth insulating layer I4, wherein the fifth insulating layer I5 is located between the second pixel electrode E2 and the common electrode CM. The common electrode CM and the fifth insulating layer I5 respectively have a through-hole corresponding to the second through-hole T2, and the second pixel electrode E2 is further filled in the through-holes of the common electrode CM and the fifth insulating layer I5 to be electrically connected to the second drain D2, wherein the common electrode CM is not connected to the second pixel electrode E2 and the second drain D2.

In the present embodiment, the virtual straight line L connecting between the first corner CN1 of the first pixel electrode E1 and the second corner CN2 of the second pixel electrode E2 is overlapped with the plurality of first electrode strips ES1 of the first pixel electrode E1, the virtual straight line L is substantially not parallel to the first direction ET1. In some embodiments, the virtual straight line L connecting between the first corner CN1 of the first pixel electrode E1 and the second corner CN2 of the second pixel electrode E2 is substantially not parallel to the second direction ET2. In some embodiments, the virtual straight line connecting between the center of the first through-hole T1 and the center of the second through-hole T2 is substantially parallel to the virtual straight line L. In some embodiments, the virtual straight line connecting between the center of the first through-hole T1 and the center of the second through-hole T2 is substantially parallel to and overlapped with the virtual straight line L.

When observed from the normal direction of the substrate SB1, the first contact hole CT1 of the first pixel PX1 is located between the corresponding first through-hole T1 and the first opening TH1, and the second through-hole T2 of the second pixel PX2 is located between the corresponding second contact hole CT2 and second opening TH2. The relative positions of the first contact hole CT1, the first through-hole T1, and the first opening TH1 are different from the relative positions of the second contact hole CT2, the second through-hole T2, and the second opening TH2. Therefore, the first pixel electrode E1 and the second pixel electrode E2 can be more closely arranged. In other words, the space between the first pixel electrode E1 and the second pixel electrode E2 is reduced. In the present embodiment, a portion of the first pixel electrode E1 is overlapped with the second scan line SL2, and a portion of the second pixel electrode E2 is overlapped with the third scan line SL3, but the invention is not limited thereto.

In the present embodiment, the first pixel PX1 and the second pixel PX2 have different configurations, and therefore the layout area of the portion HT1 (portion between kinks) of the first pixel electrode E1 corresponding to a high-transmittance region and the portion HT2 (portion between kinks) of the second pixel electrode E2 corresponding to a high-transmittance region can be increased to increase the transmittance and/or liquid crystal efficiency of the entire liquid crystal display apparatus 10.

Referring to FIG. 1, FIG. 2A, and FIG. 3C, the first pixel PX1 optionally further includes a first conductor layer N1. The first conductor layer N1 is, for instance, formed in the same patterning process as the transmission line DL, and the material of the first conductor layer N1 is a metal, but the invention is not limited thereto. The first conductor layer N1 is connected to the first scan line SL1 in parallel via two first holes H1 to alleviate the issue of signal attenuation due to a large impedance of a signal line.

Referring to FIG. 1, FIG. 2B, and FIG. 3C, the second pixel PX2 optionally further includes a second conductor layer N2. The second conductor layer N2 is, for instance, formed in the same patterning process as the transmission line DL, and the material of the second conductor layer N2 is a metal, but the invention is not limited thereto. The second conductor layer N2 is connected to the second scan line SL2 in parallel via two second holes H2 to alleviate the issue of signal attenuation due to a large impedance of a signal line.

In the present embodiment, the virtual straight line connecting between centers of the first holes H1 is substantially not parallel to the virtual straight line connecting between centers of the second holes H2. The first conductor layer N1 of the first pixel PX1 and the second conductor layer N2 of the second pixel PX2 have different shapes (such as symmetrical shapes) to more effectively utilize wiring space.

In the present embodiment, the liquid crystal display apparatus 10 can further include a third conductor layer N3. As shown in FIG. 1, the third conductor layer N3 is connected to the third scan line SL3 in parallel via two third holes H3 to alleviate the issue of signal attenuation due to a large impedance of a signal line. The third conductor layer N3 has, for instance, a similar shape to the first conductor layer N1.

Figure 4:
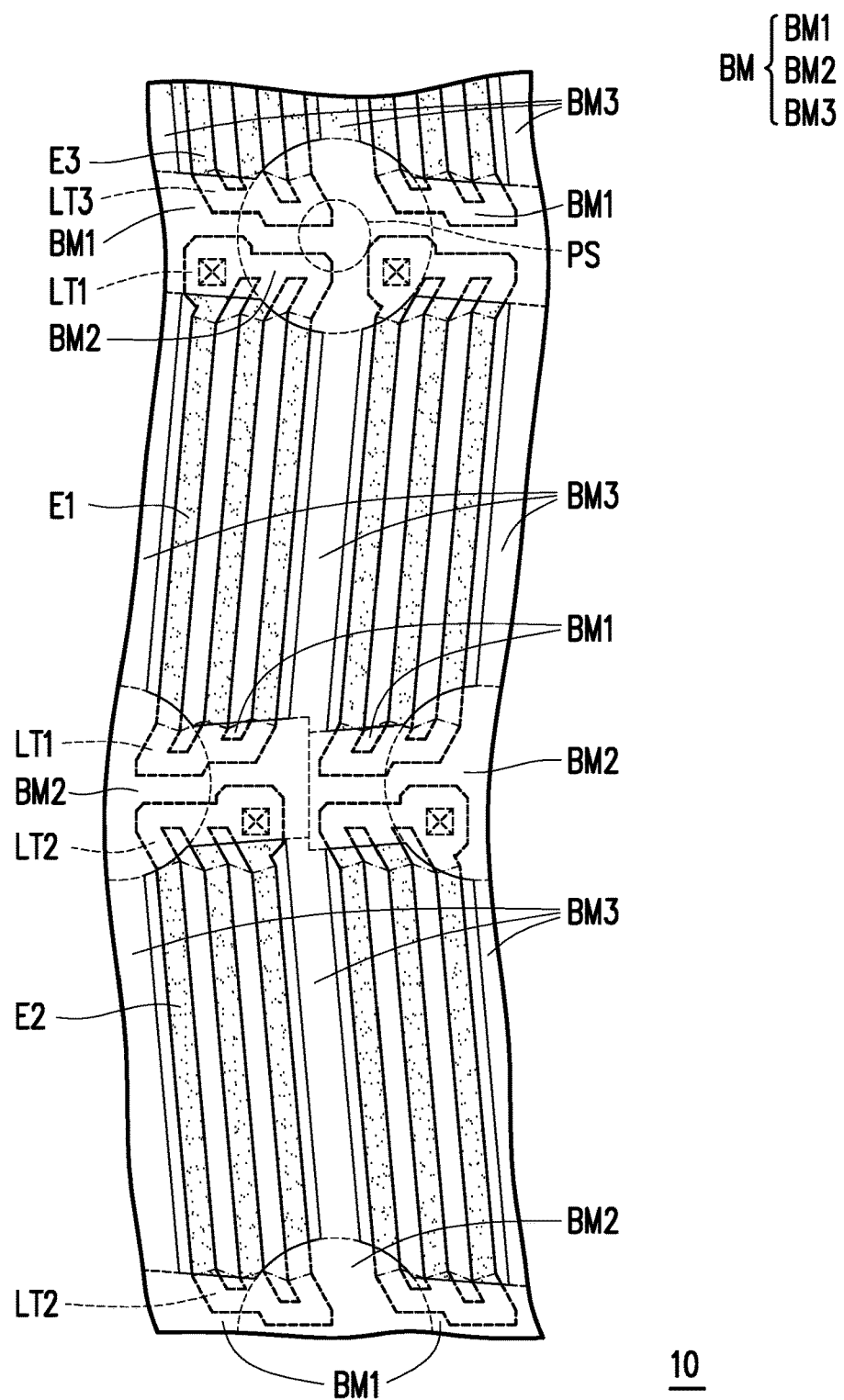
FIG. 4 is a top view of a display apparatus according to an embodiment of the invention.

FIG. 4 is a top view of a display apparatus according to an embodiment of the invention.

Please refer to all of FIG. 1, FIG. 3A to FIG. 3D, and FIG. 4. FIG. 4 only shows the light-shielding layer BM, the first pixel electrode E1, the second pixel electrode E2, the third pixel electrode E3, and the spacer PS and omits other components.

The opposite substrate 300 includes a substrate SB2 and a light-shielding layer BM. The light-shielding layer BM is disposed on the substrate SB2, and when observed along the normal direction of the substrate SB2, referring to both FIG. 1 and FIG. 4, the light-shielding layer BM covers the first opening TH1, the second opening TH2, the first contact hole CT1, the second contact hole CT2, the first hole H1, the second hole H2, and the third hole H3. In a preferred embodiment, the light-shielding layer BM completely covers the first opening TH1, the second opening TH2, the first contact hole CT1, the second contact hole CT2, the first hole H1, the second hole H2, and the third hole H3. The light-shielding layer BM includes a first light-shielding layer BM1, a second light-shielding layer BM2, and a third light-shielding layer BM3.

When observed along the normal direction (such as a direction perpendicular to the substrate SB1 or the substrate SB2), a portion of an edge of the first light-shielding layer BM1 is adjacent to the virtual line (such as the virtual line X1 or the virtual line X2) connecting the kinks of the pixel electrode. In some embodiments, when observed along the normal direction (such as a direction perpendicular to the substrate SB1 or the substrate SB2), a portion of an edge of the first light-shielding layer BM1 is overlapped with the virtual line (such as the virtual line X1 and the virtual line X2) connecting the kinks of the pixel electrode. The overlap comprises, for instance, a plurality of intersections or a plurality of line segments, and in the present embodiment, the overlap comprises a plurality of intersections, but is not limited thereto. The first light-shielding layer BM1 covers the first signal line SL1, the second signal line SL2, and the third signal line SL3. In some embodiments, the width of the first light-shielding layer BM1 remains consistent, but the invention is not limited thereto. In the present embodiment, the extending direction of the first light-shielding layer BM1 is different from the extending direction of the first signal line SL1 (first scan line), the extending direction of the second signal ling SL2 (second scan line), and the extending direction of the third signal line SL3 (third scan line). Therefore, the width of the first light-shielding layer BM1 does not need to be large to cover the low-transmittance regions of the first pixel electrode E1, the second pixel electrode E2, and the third pixel electrode E3. In the present embodiment, the extending direction of the first light-shielding layer BM1 located on the first signal line SL1 is different from the extending direction of the first light-shielding layer BM1 on the second signal line SL2.

The second light-shielding layer BM2 is connected to the first light-shielding layer BM1. The width of the second light-shielding layer BM2 is, for instance, greater than the width of the first light-shielding layer BM1, and the contour of the second light-shielding layer BM2 is, for instance, circular. The spacer PS is located between the opposite substrate 300 and the array substrate 100. The second light-shielding layer BM2 corresponds to and is overlapped with the spacer PS, and the contour of the second light-shielding layer BM2 is, for instance, the same as the contour of the spacer PS, but the invention is not limited thereto. The spacer PS is, for instance, configured to control the distance between the opposite substrate 300 and the array substrate 100, i.e., configured to control the thickness of the liquid crystal layer 200 (or liquid crystal layer gap). The contour of the spacer PS is, for instance, circular, rectangular, trapezoidal, or other suitable shapes.

The first light-shielding layer BM1 and the second light-shielding layer BM2, for instance, cover portions (such as the portions LT1, LT2, and LT3) of the first pixel electrode E1, the second pixel electrode E2, and the third pixel electrode E3 corresponding to low-transmittance regions. In some embodiments, the first light-shielding layer BM1 and the second light-shielding layer BM2 completely cover portions (such as the portions LT1, LT2, and LT3) of the first pixel electrode E1, the second pixel electrode E2, and the third pixel electrode E3 corresponding to low-transmittance regions. The first light-shielding layer BM1 and/or the second light-shielding layer BM2 may be overlapped with at least a portion of the virtual line X1 and/or at least a portion of the virtual line X2.

The third light-shielding layer BM3 is connected to the second light-shielding layer BM2 and/or the first light-shielding layer BM1. The third light-shielding layer BM3 corresponds to and covers the transmission line DL.

In some embodiments, the opposite substrate 300 further includes a filter device (not shown), and the filter device, for instance, corresponds to the colors filter films disposed in correspondence to the locations of the first pixel electrode E1, the second pixel electrode E2, and the third pixel electrode E3. In some embodiments, the filter device can also be disposed in the array substrate 100 to form a color filter-on-array (COA) structure.

At least one embodiment of the invention can reduce the width of the light-shielding layer to increase the aperture ratio of the liquid crystal display apparatus.

At least one embodiment of the invention can increase the arrangement density of the pixel electrode to increase the transmittance and liquid crystal efficiency of the liquid crystal display apparatus.

At least one embodiment of the invention can alleviate the issue of signal attenuation caused by large impedance of a signal line.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A liquid crystal display apparatus, comprising:
    an array substrate, comprising:
        a first pixel, comprising:
            a first active device; and
            a first pixel electrode electrically connected to the first active device via a first through-hole, wherein the first pixel electrode comprises a plurality of first electrode strips substantially extended along a first direction, each of the first electrode strips has a kink, a virtual line connecting the kinks of the first electrode strips is not straight, and the first through-hole is located at a first corner of the first pixel electrode; and
        a second pixel, comprising:
            a second active device; and
            a second pixel electrode electrically connected to the second active device via a second through-hole, wherein the second pixel electrode comprises a plurality of second electrode strips substantially extended along a second direction, the second through-hole is located at a second corner of the second pixel electrode, and a virtual straight line connecting between the first corner and the second corner is substantially not parallel to the first direction;
    a liquid crystal layer; and
    an opposite substrate, wherein the liquid crystal layer is located between the array substrate and the opposite substrate.

2. The liquid crystal display apparatus of claim 1, wherein the array substrate further comprises a first scan line, a second scan line, and a data line, the first active device is electrically connected to the first scan line and the data line, and the second active device is electrically connected to the second scan line and the data line.

3. The liquid crystal display apparatus of claim 2, wherein the array substrate further comprises:
    a first conductor layer electrically connected to the first scan line in parallel via two first holes; and
    a second conductor layer electrically connected to the second scan line in parallel via two second holes.

4. The liquid crystal display apparatus of claim 3, wherein a virtual straight line connecting between centers of the first holes is substantially not parallel to a virtual straight line connecting between centers of the second holes.

5. The liquid crystal display apparatus of claim 1, wherein:
    the array substrate further comprises a first scan line and a data line, the first active device is electrically connected to the first scan line and the data line,
    the opposite substrate comprises a first light-shielding layer,
    when observed along a normal direction, a portion of an edge of the first light-shielding layer is adjacent to the virtual line, and
    an extending direction of the first light-shielding layer is different from an extending direction of the first scan line.

6. The liquid crystal display apparatus of claim 5, further comprising:
    a spacer located between the opposite substrate and the array substrate, wherein the opposite substrate further comprises a second light-shielding layer overlapped with the spacer, and a width of the second light-shielding layer is greater than a width of the first light-shielding layer.

7. The liquid crystal display apparatus of claim 6, wherein the second light-shielding layer is connected to the first light-shielding layer, and the virtual straight line connecting between the first corner and the second corner is substantially not parallel to the second direction.

8. The liquid crystal display apparatus of claim 1, wherein the array substrate further comprises a first scan line and a data line, wherein the first active device is electrically connected to the first scan line and the data line, the opposite substrate comprises a first light-shielding layer, and when observed along a normal direction, the first light-shielding layer covers the kinks, and an extending direction of the first light-shielding layer is different from an extending direction of the first scan line.

9. The liquid crystal display apparatus of claim 8, further comprising:
a spacer located between the opposite substrate and the array substrate, wherein the opposite substrate further comprises a second light-shielding layer overlapped with the spacer, and a width of the second light-shielding layer is greater than a width of the first light-shielding layer.

10. The liquid crystal display apparatus of claim 9, wherein the second light-shielding layer is connected to the first light-shielding layer, and the virtual straight line connecting between the first corner and the second corner is substantially not parallel to the second direction.

11. The liquid crystal display apparatus of claim 1, wherein
the first active device comprises:
a first gate;
a first semiconductor layer located on the first gate; and
a first source and a first drain electrically connected to the first semiconductor layer; and
the second active device comprises:
a second gate;
a second semiconductor layer located on the second gate; and
a second source and a second drain electrically connected to the second semiconductor layer,
and wherein each of the first semiconductor layer and the second semiconductor layer comprises a first portion, a second portion, and a third portion connected in order to form a U-shape or a 7-shape.

12. The liquid crystal display apparatus of claim 11, wherein the first semiconductor layer is electrically connected to the first drain via a first contact hole, and the second semiconductor layer is electrically connected to the second drain via a second contact hole.

13. The liquid crystal display apparatus of claim 12, wherein
the first pixel electrode further comprises a first connecting portion electrically connected to the first electrode strips, and the first connecting portion is overlapped with the first contact hole; and
the second pixel electrode further comprises a second connecting portion electrically connected to the second electrode strips, and the second connecting portion is overlapped with the second contact hole.

14. A liquid crystal display apparatus, comprising:
an array substrate, comprising
a first pixel, comprising:
a first active device; and
a first pixel electrode electrically connected to the first active device via a first through-hole, wherein the first pixel electrode comprises a plurality of first electrode strips substantially extended along a first direction;
a second pixel, comprising:
a second active device; and
a second pixel electrode electrically connected to the second active device via a second through-hole, wherein the second pixel electrode comprises a plurality of second electrode strips substantially extended along a second direction; and
a first signal line, a second signal line, and a transmission line located on the array substrate, wherein the first active device is electrically connected to the first signal line and the transmission line, the second active device is electrically connected to the second signal line and the transmission line, a horizontal distance between the first through-hole and the transmission line is L1, a horizontal distance between the second through-hole and the transmission line is L2, and $0.02 \leq L2/L1 \leq 0.3$;
a liquid crystal layer; and
an opposite substrate, wherein the liquid crystal layer is located between the array substrate and the opposite substrate.

15. The liquid crystal display apparatus of claim 14, wherein the first through-hole is located at a first corner of the first pixel electrode, the second through-hole is located at a second corner of the second pixel electrode, and a virtual straight line connecting between the first corner and the second corner is substantially not parallel to the first direction.

16. The liquid crystal display apparatus of claim 14, wherein
the first active device comprises:
a first gate;
a first semiconductor layer located on the first gate; and
a first source and a first drain electrically connected to the first semiconductor layer; and
the second active device comprises:
a second gate;
a second semiconductor layer located on the second gate; and
a second source and a second drain electrically connected to the second semiconductor layer,
and wherein each of the first semiconductor layer and the second semiconductor layer comprises a first portion, a second portion, and a third portion connected in order to form a U-shape or a 7-shape.

17. The liquid crystal display apparatus of claim 16, wherein the first semiconductor layer is electrically connected to the first drain via a first contact hole, and the second semiconductor layer is electrically connected to the second drain via a second contact hole.

18. The liquid crystal display apparatus of claim 17, wherein the first contact hole is located between the transmission line and the first through-hole, and the second through-hole is located between the transmission line and the second contact hole.

19. A liquid crystal display apparatus, comprising:
an array substrate, comprising:
a first pixel, comprising:
a first active device; and
a first pixel electrode electrically connected to the first active device via a first through-hole, wherein the first pixel electrode comprises a plurality of first electrode strips substantially extended along a first direction, and the first through-hole is located at a first corner of the first pixel electrode;
a second pixel, comprising:
a second active device; and
a second pixel electrode electrically connected to the second active device via a second through-hole, wherein the second pixel electrode comprises a plurality of second electrode strips substantially extended along a second direction, the second through-hole is located at a second corner of the second pixel electrode, and a virtual straight line connecting between the first corner and the second corner is substantially not parallel to the first direction;

a first scan line electrically connected to the first active device;

a second scan line electrically connected to the second active device;

a first conductor layer electrically connected to the first scan line in parallel via two first holes; and a second conductor layer electrically connected to the second scan line in parallel via two second holes;

a liquid crystal layer; and an opposite substrate, wherein the liquid crystal ayer is located between the array substrate and the opposite substrate.

20. A liquid crystal display apparatus, comprising:
an array substrate, comprising:
    a first pixel, comprising:
        a first active device, comprising:
            a first gate;
            a first semiconductor layer located on the first gate; and
            a first source and a first drain electrically connected to the first semiconductor layer; and
        a first pixel electrode electrically connected to the first active device via a first through-hole, wherein the first pixel electrode comprises a plurality of first electrode strips substantially extended along a first direction, and the first through-hole is located at a first corner of the first pixel electrode; and
    a second pixel, comprising:
        a second active device, comprising:
            a second gate;
            a second semiconductor layer located on the second gate, wherein each of the first semiconductor layer and the second semiconductor layer comprises a first portion, a second portion, and a third portion connected in order to form a U-shape or a 7-shape; and
            a second source and a second drain electrically connected to the second semiconductor layer; and
        a second pixel electrode electrically connected to the second active device via a second through-hole, wherein the second pixel electrode comprises a plurality of second electrode strips substantially extended along a second direction, the second through-hole is located at a second corner of the second pixel electrode, and a virtual straight line connecting between the first corner and the second corner is substantially not parallel to the first direction;

a liquid crystal layer; and an opposite substrate, wherein the liquid crystal layer is located between the array substrate and the opposite substrate.

* * * * *